US007899659B2

(12) United States Patent
Tester

(10) Patent No.: US 7,899,659 B2
(45) Date of Patent: Mar. 1, 2011

(54) RECORDING AND DISPLAYING LOGIC CIRCUIT SIMULATION WAVEFORMS

(75) Inventor: David Tester, Preston (GB)

(73) Assignee: LSI Corporation, Milpitas, CA (US)

(*) Notice: Subject to any disclaimer, the term of this patent is extended or adjusted under 35 U.S.C. 154(b) by 2314 days.

(21) Appl. No.: 10/452,260

(22) Filed: Jun. 2, 2003

(65) Prior Publication Data

US 2004/0243372 A1 Dec. 2, 2004

(51) Int. Cl.
*G06F 17/50* (2006.01)
(52) U.S. Cl. ..................... 703/14; 345/440.1
(58) Field of Classification Search ............. 703/13–15; 345/418, 440, 440.1
See application file for complete search history.

(56) References Cited

U.S. PATENT DOCUMENTS

| 6,925,430 | B2* | 8/2005 | Suwada et al. | 703/15 |
| 7,268,783 | B2* | 9/2007 | Parish et al. | 345/440.1 |
| 2002/0032555 | A1* | 3/2002 | Suwada et al. | 703/14 |

OTHER PUBLICATIONS

Sahoo et al., N.C. Determination of Current Waveforms for Torque Ripple Minimisationin Switched Reluctance Motors Using Iterative Learning: An Investigation, IEE Proceedings—Electric Power Applications, Jul. 1999, pp. 369-377.*
Yousseff, O.A.S. Discrimination between Faults and Magnetising Inrush Currents in Transformers Based on Wavelet Transforms, Electric Power Systems Research, vol. 63, Sep. 2002, pp. 87-94.*
Ghosh, S. Fundamental Principles of Modeling Timing in Hardware Description Languages, Journal of Systems Architecture, vol. 47, May 2001, pp. 405-426.*

* cited by examiner

*Primary Examiner*—Russell Frejd
(74) *Attorney, Agent, or Firm*—Christopher P. Maiorana, PC

(57) ABSTRACT

A method for generating a compressed representation of a simulated waveform is disclosed. The method may have the steps of: (a) processing circuit model information, (b) identifying a segment of stable repetition; and (c) generating the compressed representation. Step (a) may generate waveform information representing a simulated waveform occurring in the circuit model. Step (b) may identify the segment in the waveform information. In step (c), the compressed waveform information may define the segment by (i) cycle information representing the waveform cycle and (ii) repetition information representing the stable repetitions of the waveform cycle to form the segment.

25 Claims, 10 Drawing Sheets

RECORDING AND DISPLAYING LOGIC CIRCUIT SIMULATION WAVEFORMS

FIELD OF THE INVENTION

The present invention may relate to the field of simulation of electronic logic circuit behaviour, for example, for an integrated circuit. The invention may especially relate to recording and displaying logic signal waveforms generated by such a simulation.

BACKGROUND OF THE INVENTION

A simulation tool running on a computer is used to test a logic circuit design for an integrated circuit prior to manufacture of the integrated circuit. Logic signal waveforms generated in the simulation are recorded and later analysed by using a waveform display tool. A typical logic simulation of a circuit block of an Application Specific Integrated Circuit (ASIC) involves the use of one or more clocks running for an extended period of time. The clocks are normally of the order of tens to hundreds of Megahertz (MHz), and a simulation time is normally from several milliseconds to a second. Recording such high frequency signals results in a vast amount of recorded data. One common file format used to record all simulation logic waveforms is the industry standard Value Change Dump (VCD) format. The VCD format records separate transition data for each transition edge in the signal. However, the size of a VCD format file is often prohibitively large to be handled by the waveform display tool. File size problems include (i) a file being too large to be loaded; (ii) causing the waveform display tool to crash in use; and (iii) forcing the user to select only a small portion of the recorded waveforms to load, making it difficult to compare waveforms at different times in the recorded simulation.

Further problems relate to the displaying of recorded clock signals by the waveform display tool. Often, the frequencies of the clock signals are several orders of magnitude higher than most of the other signals in the simulation. When displaying waveforms over an extended period of time in a time-compressed window, a large number of clock signal transitions are displayed. The clock signals are compressed along a time-axis of the display window. Individual edges of a signal can only be distinguished in the display provided that that waveform detail does not exceed the resolution of the display apparatus. In many cases individual edges are not distinguishable. The speed at which the display tool can generate a display of the waveform depends largely on the number of waveform transitions that are displayed. Graphics vectors are drawn for each transition to show the waveform shape. Displaying the clock signals often occupies up to 75% of the display generation overhead. Such overhead is wasted if the time-axis compression is such that individual clock edges are not distinguishable in the generated display.

SUMMARY OF THE INVENTION

The present invention may provide a method of generating a compressed representation of a simulated waveform. The method may have the steps of: (a) processing circuit model information, (b) identifying a segment of stable repetition; and (c) generating the compressed representation. Step (a) may generate waveform information representing a simulated waveform occurring in the circuit model. Step (b) may identify the segment in the waveform information. In step (c), the compressed waveform information may define the segment by (i) cycle information representing the waveform cycle and (ii) repetition information representing the stable repetitions of the waveform cycle to form the segment.

Advantages, features and objects of the invention may include: (i) enabling faster generation of a display of high frequency signals in a time-compressed display; (ii) reducing a graphics generation overhead used to display clock signals compared to other signals; (iii) optimising a display of signals or signal sections that exceed a display resolution; (iv) reducing a size of recorded files for representing simulated periodic and/or high transition-activity signals, such as clock signals; (v) enabling a small file size to represent simulated periodic and/or high transition-activity signals, such as clock signals, even over extended periods of time; (vi) providing different waveform file formats suited to the amount of periodic repetition and/or transition-activity in a waveform; and/or (vii) enabling a waveform display tool to efficiently load and display an entire recording of a simulation including periodic and/or high transition-activity signals, such as clock signals, over an extended period of time. Other features, objects and advantages of the invention will become apparent from the following description, claims and/or drawings.

BRIEF DESCRIPTION OF THE DRAWINGS

Non-limiting preferred embodiments of the invention are now described, by way of example only, with reference to the accompanying drawings, in which.

DETAILED DESCRIPTION OF THE PREFERRED EMBODIMENTS

Figure 1:
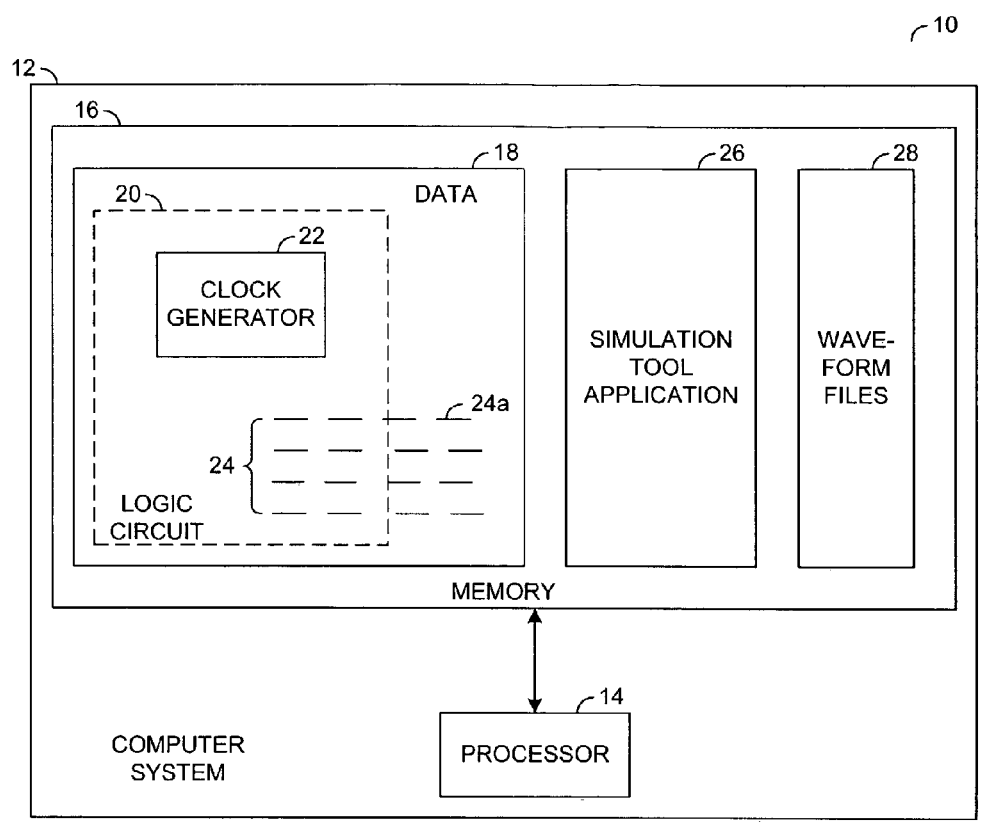
FIG. 1 is a schematic block diagram of a simulation tool in the preferred embodiment.

Referring to FIG. 1 a computerized simulation tool 10 may comprise a first computer system 12 including a processor 14 communicating with one or more regions of storage 16. The computer system 12 may comprise a workstation (not shown) coupled to a network (not shown). At least a portion of the storage 16 may be on the network (not shown). The storage 16 may include regions of one or more of magnetic media (e.g., a hard disc), optical media, and semiconductor media (e.g., memory circuitry). Stored in the storage 16 may be data 18 representing a model 20 of a logic circuit whose operation may be simulated. The logic circuit model 20 may include one or more clock signal generator blocks 22 for generating one or more clock signals for the logic circuit model 20. The logic circuit model 20 may include one of more interface nodes 24 for inputting and/or outputting signals to/from the logic circuit model 20. One or more of the nodes 24 may be a clock input node 24a for accepting a clock signal from a source (not shown) external to the logic circuit model 20. Also stored in the memory 16 may be a simulation software application 26 that may be executable by the processor 14. The software application 26 may process the data 18 to simulate operation of the logic circuit model 20 represented by the data 18. The software application 26 may simulate how signal levels in the logic circuit model 20 may change during simulated operation of the logic circuit model 20 over a certain time period. For example, the time period may be any predetermined period up to about a second or more. The software application 26 may simulate generation of external signals to be applied as inputs to respective nodes 24 of the logic circuit model 20. For example, the software application 26 may simulate generation of external clock signals applied to the one or more of the clock input nodes 24a. The manner in which the software application operates to simulate operation of the logic circuit model 20 is known to one of ordinary skill in the art, and so may not be described further here in detail.

Figure 2:
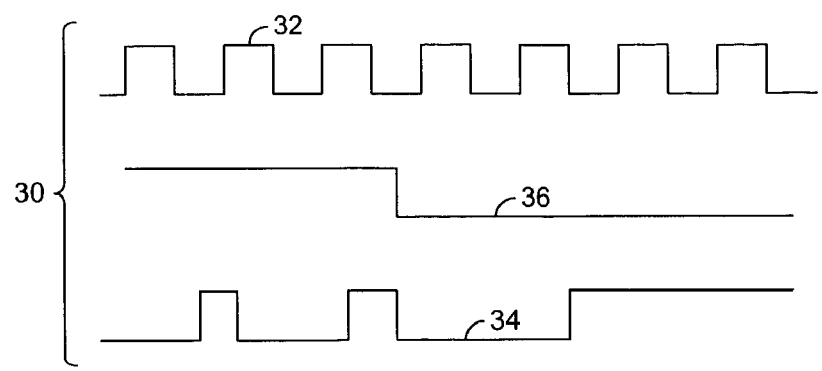
FIG. 2 is a schematic view of example signal waveforms occurring in a simulation performed by the simulation tool of FIG. 1.

The software application 26 may further generate output data (e.g., waveform information). The output data may represent one or more signal waveforms 30 (FIG. 2) generated during the simulation. The output data may be recorded in one or more compressed output files (also called waveform files) 28 that may be stored in the memory 16 or in other recording media. FIG. 2 may illustrate schematically examples of signal waveforms 30 that may be generated during the simulation. These signal waveforms 30 are merely examples, and the specific signals may vary according to the logic circuit model 20 and/or the simulation conditions. The signal waveforms 30 may include a clock signal waveform 32, a data signal waveform 34 and a control signal waveform 36. The clock signal waveform 32 may generally have one or more of the following characteristics: (a) the clock signal waveform 32 may be periodic; (b) the clock signal waveform 32 may have a known fixed or predictably varying frequency; and/or (c) the clock signal waveform 32 may include generally a higher transition-activity (e.g., more signal state transitions) than the other signals 34 and 36. The present embodiment may provide different compression formats for recording different waveforms 30. A first format 40 (FIG. 4) may be especially suitable for one or more of the waveforms 30 having a low degree of repetition periodicity and/or transition-activity (such as a typical data or control signal, illustrated by the waveform 34 or 36). A second format 42 (FIG. 5) may be especially suitable for one or more of the waveforms 30 having a high degree of repetition periodicity and/or transition-activity (such as a typical clock signal, illustrated by the waveform 32).

Figure 3:
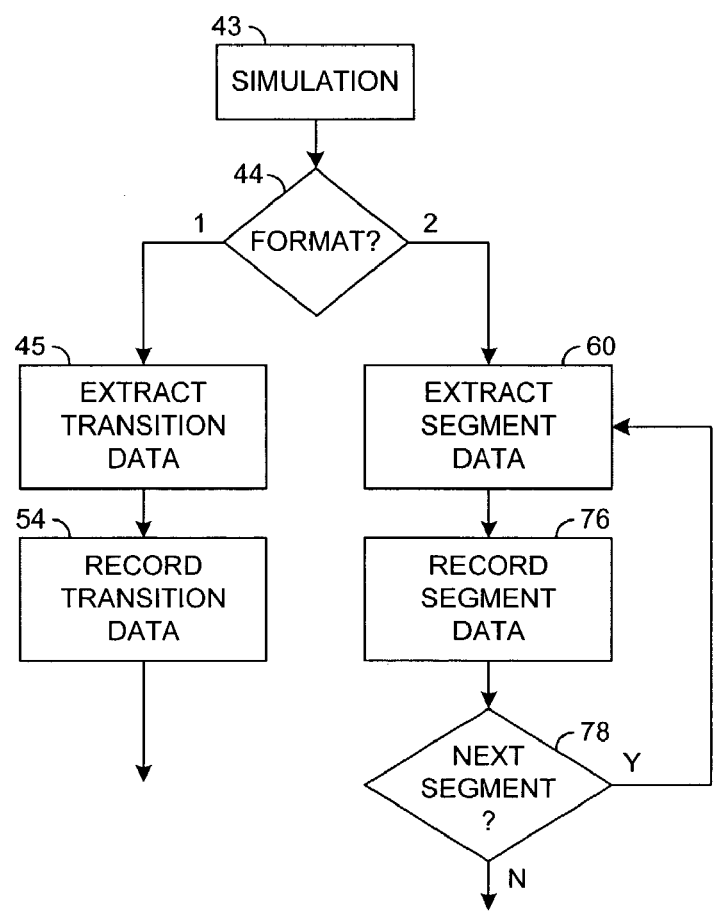
FIG. 3 is a schematic flow diagram of a process for recording simulation signal waveforms generated by the simulation tool.
Figure 4:
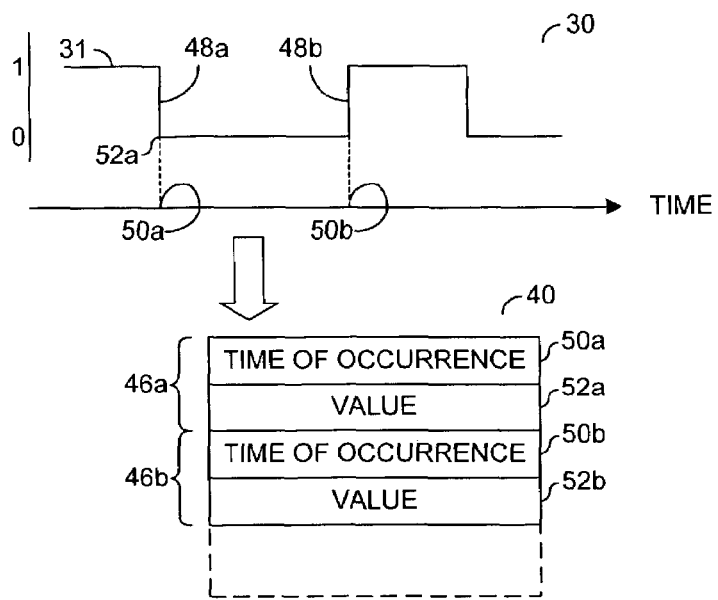
FIG. 4 is a schematic representation of a first file format for recording a waveform signal.
Figure 5:
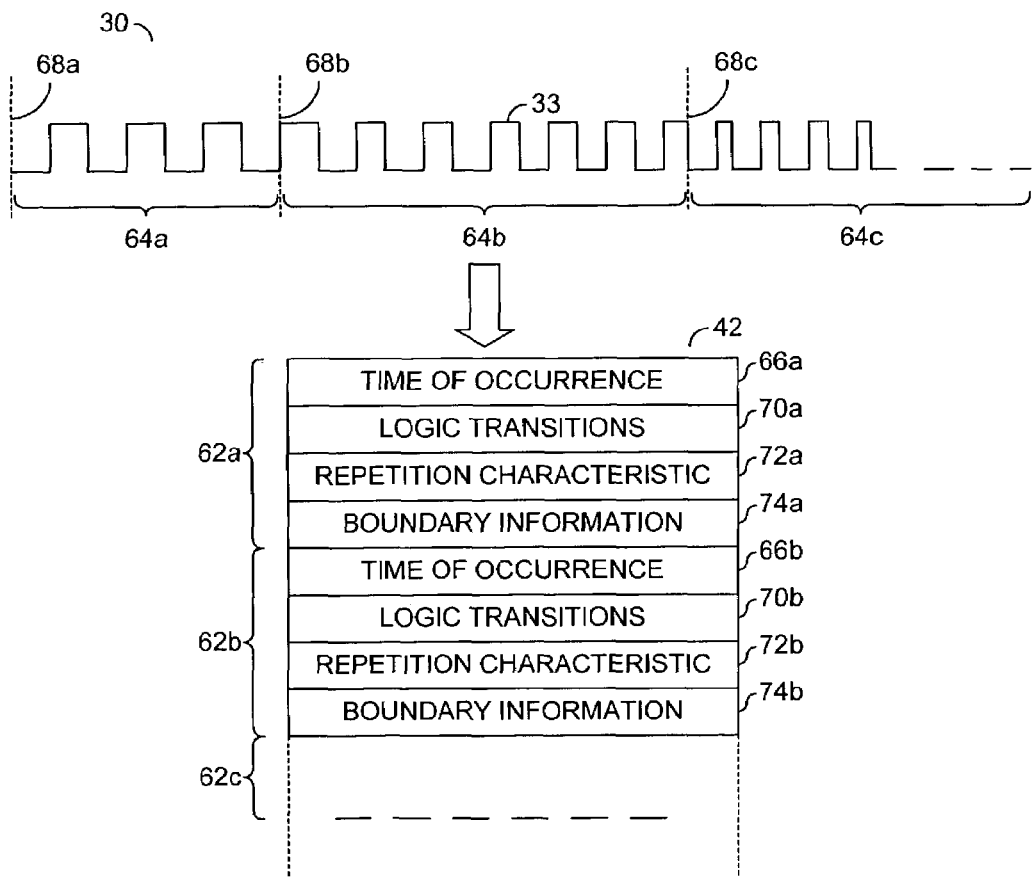
FIG. 5 is a schematic representation of a second file format for recording a waveform signal.

FIG. 3 may illustrate a method for generating and/or recording the compressed waveform files 28 from the output data representing the signal waveforms 30 produced by the simulation (shown as a generic step 43. FIGS. 4 and 5 may illustrate further example waveforms and the first and second file formats 40 and 42. Referring to FIG. 3, for each of the signal waveforms 30, a first decision step 44 may be performed. The first decision step 44 may determine whether each respective signal waveform among the signal waveforms 30 may be recorded using the first file format 40 or using the second file format 42, according to a predetermined condition. The predetermined condition may be based on one or more of: (a) the degree of periodic repetition in the respective waveforms 30; (b) the amount of transition-activity in the respective waveforms 30; and/or (c) a manual selection of the file format for the respective waveforms 30.

When step 44 may determine that a respective signal waveform 31 (FIG. 4) among the signal waveforms 30 may be recorded using the first file format 40, processing may proceed to step 45 at which characteristic data 46 for the first format may be detected or extracted from the signal waveform 31. The first file format 40 may be a VCD format. Referring to FIG. 4, the first file format 40 may include first units or blocks of data 46a, 46b, etc. associated with each individual transition 48a, 48b, etc. in the respective signal waveform 31. Each block of data 46 may include a time 50 of occurrence of the transition 48 in the respective signal waveform 31. Each block of data 46 may also include a value 52 directly or indirectly representing a state of the respective signal waveform 31 after the transition. When the respective signal waveform 31 may be a binary signal, the value 52 may be omitted (for example, when the transition may assumed to toggle a previous value). In a more elaborate implementation, multiple states may be represented even for a binary signal. Representing multiple states may provide a realistic representation that a gate may take a finite switching time for switching from one state to another. The representation may include one or more intermediate states to indicate that the signal level may be changing dynamically between stable states. The representation may include one or more undefined states to indicate that the logic state may be undefined (for example, at power-up, or if the logic state has not been defined). At step 54 (FIG. 3), the block of data 46 may be recorded for each transition 48. The size of a file recorded with the first format 40 may depend on the number of transitions 48 in the respective signal waveform 31. The first format 40 may be especially suitable for a respective signal waveform 31 having a low periodic repetition and/or a low transition-activity.

When step 44 may determine that a respective signal waveform 33 (FIG. 5) of the signal waveforms 30 may be recorded using the second file format 42, processing may proceed to step 60 at which characteristic data 62 for the second format 42 may be detected or extracted from the signal waveform 33. The second file format 42 (FIG. 5) may include characteristic data (second units of information) 62a, 62b, 62c associated with each segment 64a, 64b, 64c of stable periodic repetition in the signal waveform 33. Different segments (e.g., 64a and 64b) may be distinguished by different repetition characteristics (for example, if a clock signal may change in frequency). Additionally or alternatively, different segments (e.g., 64b and 64c) may be distinguished by different repetition cycles (for example, if a pulse width changes). The respective characteristic data 62 for each segment 64 may generally include waveform cycle information associated with the repeated cycle, and/or repetition information associated with the repetition of the cycle to form the segment. In particular, the characteristic data 62 for each segment 64a-c may include one or more of: a time 66 of occurrence of the first transition edge 68 in the segment 64, logic transitions 70 associated with a single cycle, a repetition characteristic 72 of a single cycle, and/or boundary information 74 for the segment 64. The logic transitions 70 may include a mark:space ratio characteristic of a single cycle. The repetition characteristic 72 may be a frequency or period of repetition of a single cycle.

The boundary information 74 may identify one or more of a start time for the segment 64, an end time for the segment 64, and/or a duration of the segment 64. The duration may be represented as a time duration or a number of repetitions of the single cycle within the segment 64. Referring again to FIG. 3, step 60 may determine the characteristic data 62 in a number of possible ways. For example, the data 62 may be determined from an analysis of the waveform, or from a predictable behavioural model, or by processing control information from which the waveform may be derived. The control information may control direct simulation of the waveform, for example, for simulated signals external to the logic circuit 20 or applied to the logic circuit 20. At step 76, the block of characteristic data 62 for the respective segment 64 may be recorded. Step 78 may determine whether a next segment 64 may exist. When a next segment 64 may exist, then recording processing may return to step 60 for processing the next segment 64.

The file size of a waveform file 28 recorded using the second file format 42 may not depend on the number of transitions within the respective signal waveform 33. Instead, the file size may depend on the number of segments 64 of stable repetition within the signal waveform 33. The second file format 42 may therefore be especially suitable for recording a signal waveform 33 having a high degree of periodic repetition and/or a large amount of transition-activity. For such types of signal waveforms 30, the file size may be significantly smaller when recorded using the second file format 42 than when recorded using the first file format 40.

Figure 6:
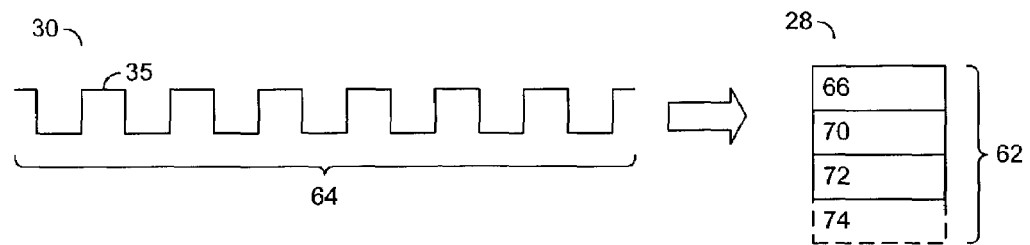
FIG. 6 is a schematic representation of the second file format of FIG. 5 used to represent a continuous periodic waveform signal.

Referring to FIG. 6, a signal waveform 35 of the signal waveforms 30 that is stable in frequency and cycle throughout the duration of the simulation, may be recorded extremely efficiently using the second file format 42. For example, the stable signal waveform 35 may be a stable clock signal. The signal waveform 35 may be represented by a single segment 64, and the waveform file 28 may contain only a single block of data 62 associated with that segment 64. Within the block of data 62, the boundary information 74 may be omitted because there may be no boundary with a subsequent segment 64. Alternatively, the boundary information 74 may be set to default information indicating that there is no further segment 64. When the second file format 42 may be used to represent a stable signal waveform 35, the file size may be independent of the duration of simulation. The waveform file 28 may contain a single block of data 62 that may be same whether the simulation involves only several cycles or an infinite number of cycles.

Figure 7:
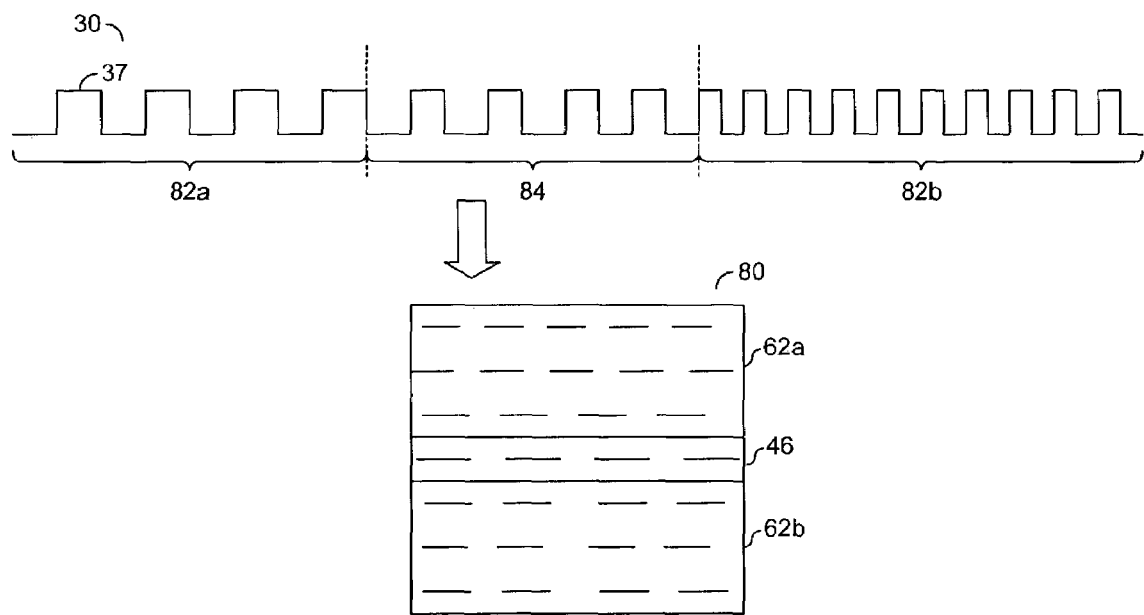
FIG. 7 is a schematic representation of a hybrid file format combining the file formats of FIGS. 4 and 5.

Referring to FIG. 7, a hybrid file format 80 may be used to represent a respective signal waveform 37 of the signal waveforms 30 that may include one or more "stable" segments 82 of stable periodic repetition, and one or more "varying" segments 84 in which a characteristic of the signal waveform 37 may vary. For example, the characteristic may be the frequency of the signal waveform, or the mark:space ratio. Each stable segment 82 may be represented using a block of data 62 from the second file format 42. Each varying segment 84 may be represented using a block of data 46 from the first file format 40. The hybrid file format 80 may enable the efficiencies of the second file format 42 to be used to reduce the magnitude of recorded data, while still enabling varying signal characteristics to be represented accurately. The hybrid file format 80 may be generated using a method that combines the method steps described previously with respect to FIG. 3.

Figure 8:
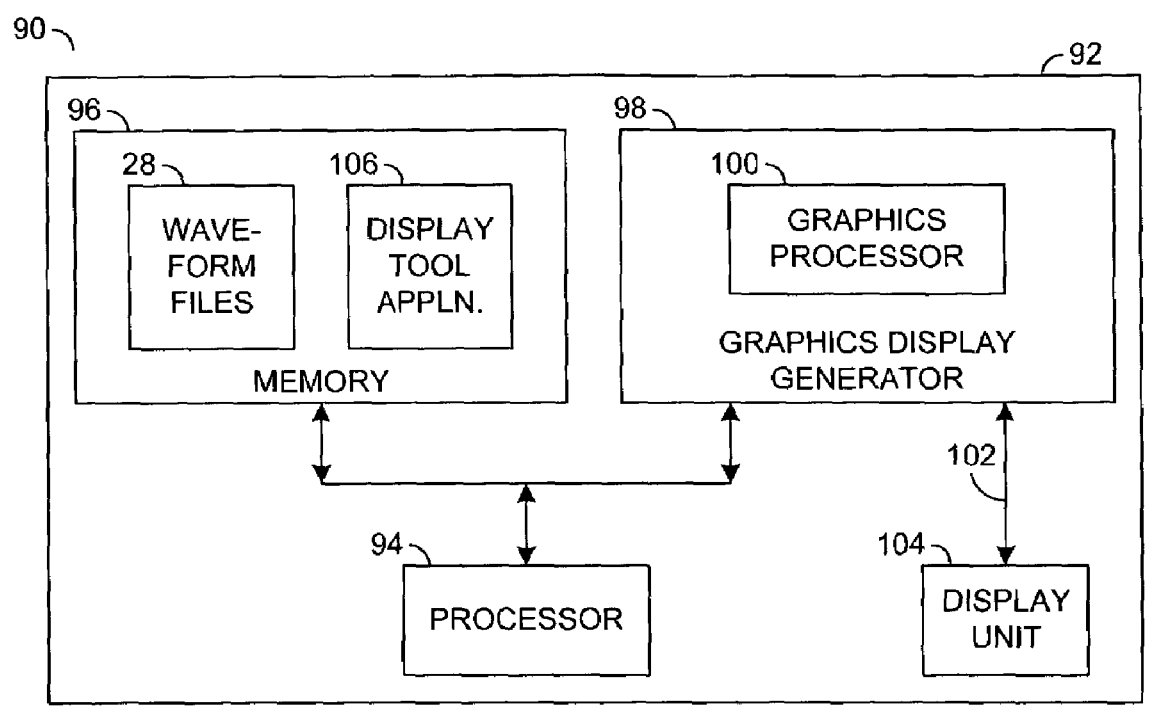
FIG. 8 is a schematic block diagram of a waveform display tool in a preferred embodiment.

FIG. 8 may illustrate schematically a computerized waveform display tool 90 for displaying signal waveforms 30 recorded by the simulation tool 10. The display tool 90 may comprise a second computer system 92 including a processor 94 communicating with one or regions of storage 96 and a graphics display generator 98. The graphics display generator may include a dedicated graphics processor 100. The graphics display generator 98 may generate a display signal 102 for a display unit 104. The second computer system 92 may be the same system as the first computer system 12 described above, or may share similarities with the first computer system. The recorded waveform files 28 may be stored or loaded in the memory 96. The storage 96 may also store a waveform display software application 106 executable by the processor 94. The software application 106 may process the waveform files 28 to generate a display of the signal waveforms 30 represented by the waveform files 28.

Figure 9:
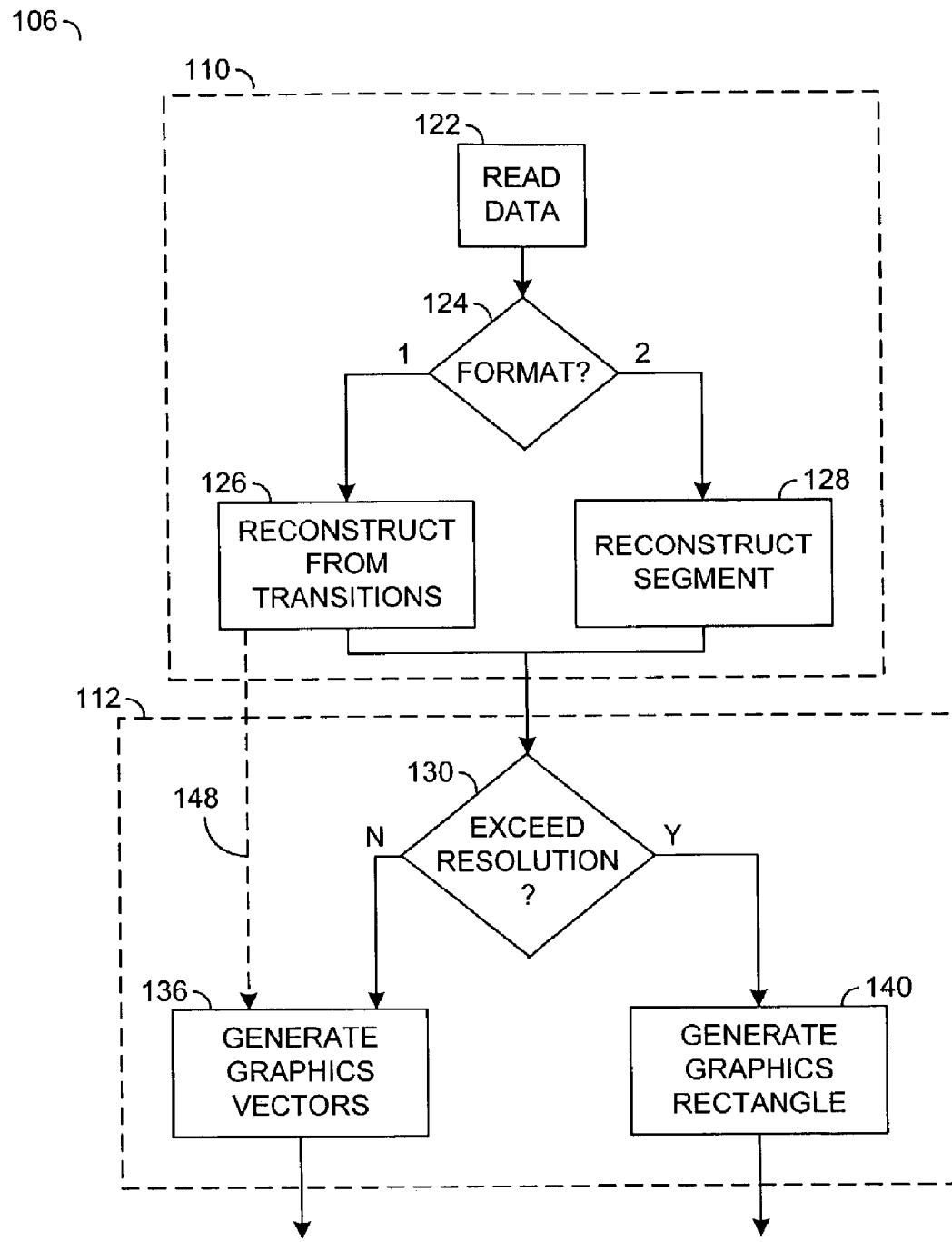
FIG. 9 is a schematic flow diagram illustrating a method used in the waveform display tool for displaying a waveform from a signal recorded using the waveform simulation tool.

Referring to FIG. 9, the software application 106 may generally comprise a first section 110 and a second section 112. The first section 110 may process the waveform files 28 to re-construct the waveform signals 30 from the recorded data. The operation of the first section 110 may be referred to as "expanding" the recorded data. The first section 110 may include a step 122 of reading data from one or more of the waveform files 28. At step 124, a determination may be made about whether the data may of the first file format 40 or the second file format 42. When the data may be of the first file format 40, processing may branch to step 126 at which the signal waveforms 30 may be reconstructed from the blocks of data 46 of the first file format 40. As explained above, the data 46 of the first file format 40 may represent the transitions in the signal waveforms 30. Step 126 may reconstruct the signal waveforms 30 by adding continuous signal states between consecutive transitions. When at step 124 the data may be of the second file format 42, processing may branch to step 128 at which the signal waveforms 30 may be reconstructed from the blocks of data 62 of the second file format 42. As explained above, the data 62 of the second file format 42 may represent a segment of period repetition of a predetermined cycle. Step 128 may reconstruct the signal waveforms 30 by consecutive repetition of the single cycle based on the characteristic data 62. Step 128 may process the boundary information 74 and may determine when the segment has been fully reconstructed depending on the boundary information 74.

Figure 10A:
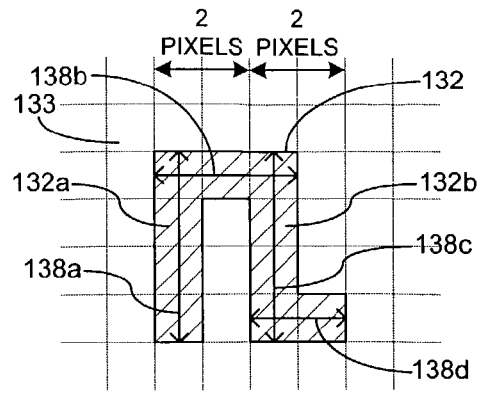
FIGS. 10a-c are schematic representations illustrating limitations of a display resolution for displaying a rapidly changing signal.
Figure 10B:
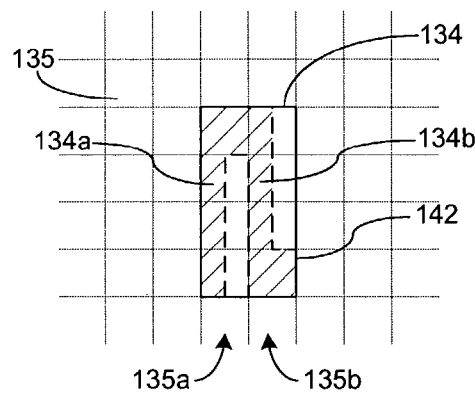
Figure 10C:
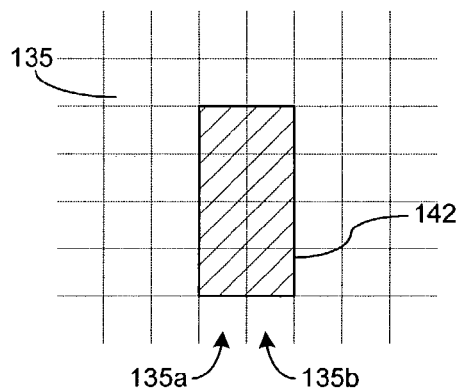

From step 126 or step 128, processing may proceed to the second section 112. The second section 112 may control the generation of the display of the signal waveforms 30 by the graphics display generator 98. At step 130, it may be determined whether, based on the scale of the time axis selected by a user, the reconstructed signal waveforms may exceed a display resolution of the graphics display generator 98 and/or the display unit 104. An example of this determination may be illustrated in FIGS. 10a-c. FIG. 10a may illustrate a first example waveform in the shape of a square wave pulse 132. The shaded regions indicate mapping of the pulse profile on display pixels 133. In order to distinguish each transition edge 132a, 132b in the display, a horizontal width of at least two pixels 133 per edge may be appropriate. Two pixels 133 per edge may allow a gap (e.g. 1 pixel width) to be displayed between the consecutive edges 132a and 132b. FIGS. 10b and 10c may illustrate an example of how the display of an equivalent waveform pulse 134 may lose detail if the square wave pulse 134 may be displayed using less than two pixels per edge. In FIG. 10b, the pulse 134 may be displayed using a total width of two pixels 135, such that each edge 134a, 134b is displayed in a single pixel width. The first edge 134a may occupy a first pixel column 135*a,* and the second edge 134*b* may occupy a second pixel column 135*b* adjacent to the first pixel column 135*a*. As best seen in FIG. 10*c,* since the adjacent pixel columns 135*a* and 135*b* may both be activated, then the resulting display may be a solid block (142) in which there may be no visible distinction (e.g., no visible gap) between the consecutive edges 134*a* and 134*b*. Therefore, for any signal displayed such that less than two-pixels may be available between consecutive edges, the waveform may be determined to exceed the display resolution, because detail of the waveform edges may be lost. The determination at step 130 may be based on a ratio of the number of pixels available to display a waveform, and the number of waveform edges to display. The number of edges may depend on the frequency of the simulation waveform and/or the duration of the simulation time.

When at step 130 it may be determined that a particular signal waveform 30 may not exceed the display resolution, processing may branch to step 136. At step 136, straight-line graphics vectors may be generated for display by the graphics display generator 98. For example, for the waveform pulse 132 of FIG. 10*a,* graphics vectors 138*a,* 138*b,* 138*c* and 138*d* may be generated to display the shape of the pulse 132. The graphics display generator 98 may process each graphics vector to display a sequence of connected straight lines from the graphics vectors 138*a-d*.

When at step 130 it may be determined that the particular signal waveform 30 may exceed the display resolution, processing may branch to set 140. At step 140, a graphics rectangle instruction may be generated to display a filled rectangle, representative of the waveform edges 134*a,* 134*b* of a waveform pulse 134 (FIG. 10*c*) that may not be clearly displayed. For example, for displaying the pulse 134 of FIG. 10*b,* a single filled rectangle 142 having a width of two pixels may be generated. The graphics display generator 98 may process the rectangle instruction rapidly. As mentioned above, the graphics display generator 98 may include a dedicated graphics processor 100 for such tasks. The generated display may appear the same to the operator (for example, a filled rectangle in which the waveform edges may not be distinguishable), but the display may be generated more efficiently than by drawing individual straight-line vectors.

Figure 11A:
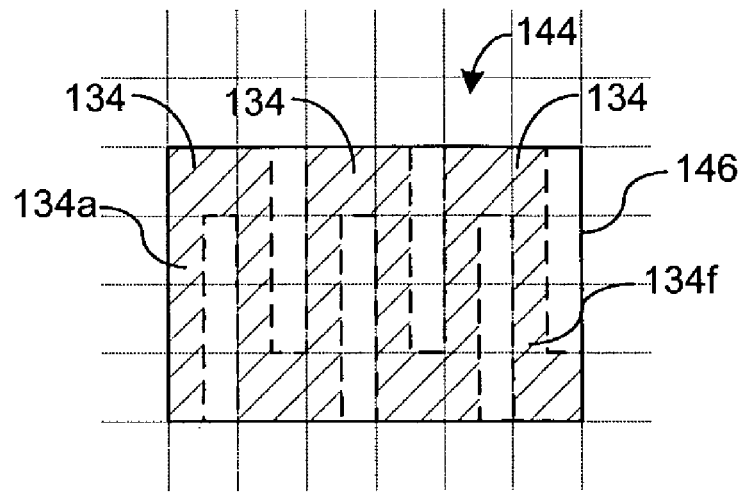
FIGS. 11a and 11b are schematic representations illustrating limitations of a display resolution for displaying plural cycles of a rapidly changing signal.
Figure 11B:
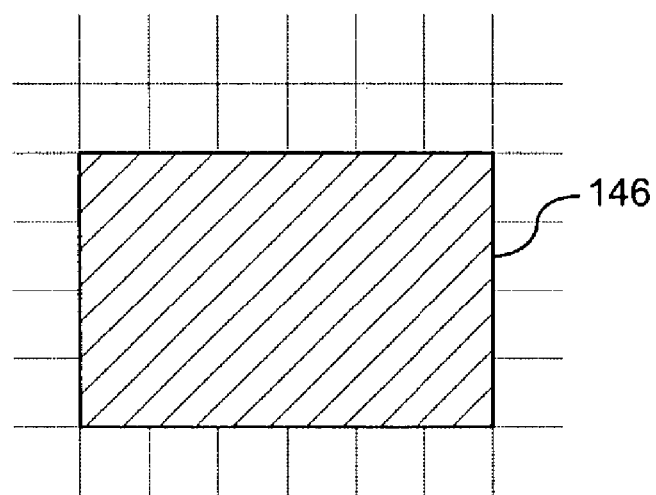

FIGS. 11*a* and 11*b* may illustrate the display of a sequence 144 of multiple square wave pulses 134 each similar to that illustrated in FIGS. 10*b* and 10*c*. In this example, the time axis may be such that a width of less than two pixels (for example, a single pixel) may be available to display each edge 134*a-f* for the pulses 134 in the sequence 144. As explained above, each pulse 134 may appear as a filled rectangle in which the edges of individual pulses 134 are not distinguishable. Therefore, the sequence 144 of multiple pulses 134 may appear as an extended filled rectangle 146 in which no pulse edges 134*a-f* may be visible. Step 140 may process the square wave pulses 134 as a complete sequence, and may generate a single filled rectangle instruction to represent the complete sequence in the display as a single elongate filled rectangle 146 (FIG. 11*b*). Using a single filled rectangle instruction to represent a sequence of multiple pulses 134 may provide a yet further reduction in display overhead. For example, if the sequence 144 extends across an entire screen display, the single filled rectangle 146 may be displayed orders of magnitude faster than the potentially thousands of straight line vectors that the single filled rectangle 146 may replace.

As a possible modification of the software application 106 (FIG. 9), processing after step 126 may proceed along line 148 bypassing step 130, and proceeding directly to step 136. With such a modification, the processing at step 140 may be applicable only to a waveform file recorded using the second file format 42. However, step 140 may statistically be used more frequently for waveform files 28 (e.g., clock signals) recorded using the second file format 42, and so the modification may not slow display generation significantly, while still enabling the efficiency of step 140 to be used for high frequency signals such as clock signals.

Figure 12A:
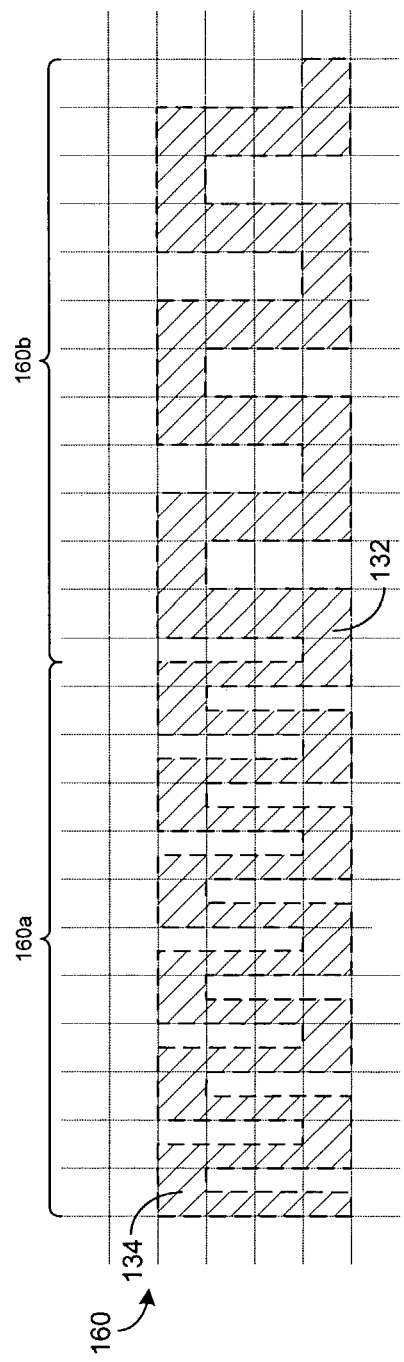
FIGS. 12a and 12b are schematic representations illustrating display of a signal having segments of different frequency.
Figure 12B:
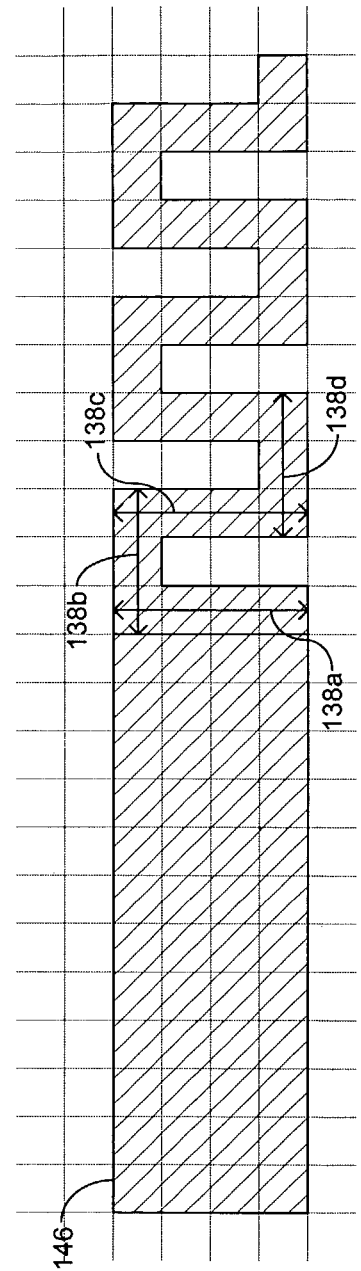

FIGS. 12*a* and 12*b* may illustrate the display of a sequence 160 including segments 160*a* and 160*b* of different frequencies. A first segment 160*a* may include one or more square wave pulses 134 each similar to that illustrated in FIG. 10*b*. In this example, the time axis may be such that the waveform for the first segment 160*a* may exceed the display resolution. A second segment 160*b* may include one or more square wave pulses 132 each similar to that illustrated in FIG. 10*a*. In this example, the frequency of pulses in the second segment 160*b* may be lower than that for the first segment 160*a*. The time axis for the display may be such that the waveform for the second segment 160*b* may not exceed the display resolution. The process of FIG. 9 may be repeated for each segment 160*a,* 160*b* in the sequence 160. Processing of the first segment 160*a* may pass through step 140. The first segment 160*a* may be displayed by a single filled rectangle 146 (FIG. 12*b*) generated using a single rectangle graphics instruction. Processing of the second segment 160*b* may pass through step 136. The second segment 160*b* may be displayed by generating the sequence of straight-line vectors 138*a-d* (FIG. 12*b*) to display the profile of each pulse 132.

Figure 13:
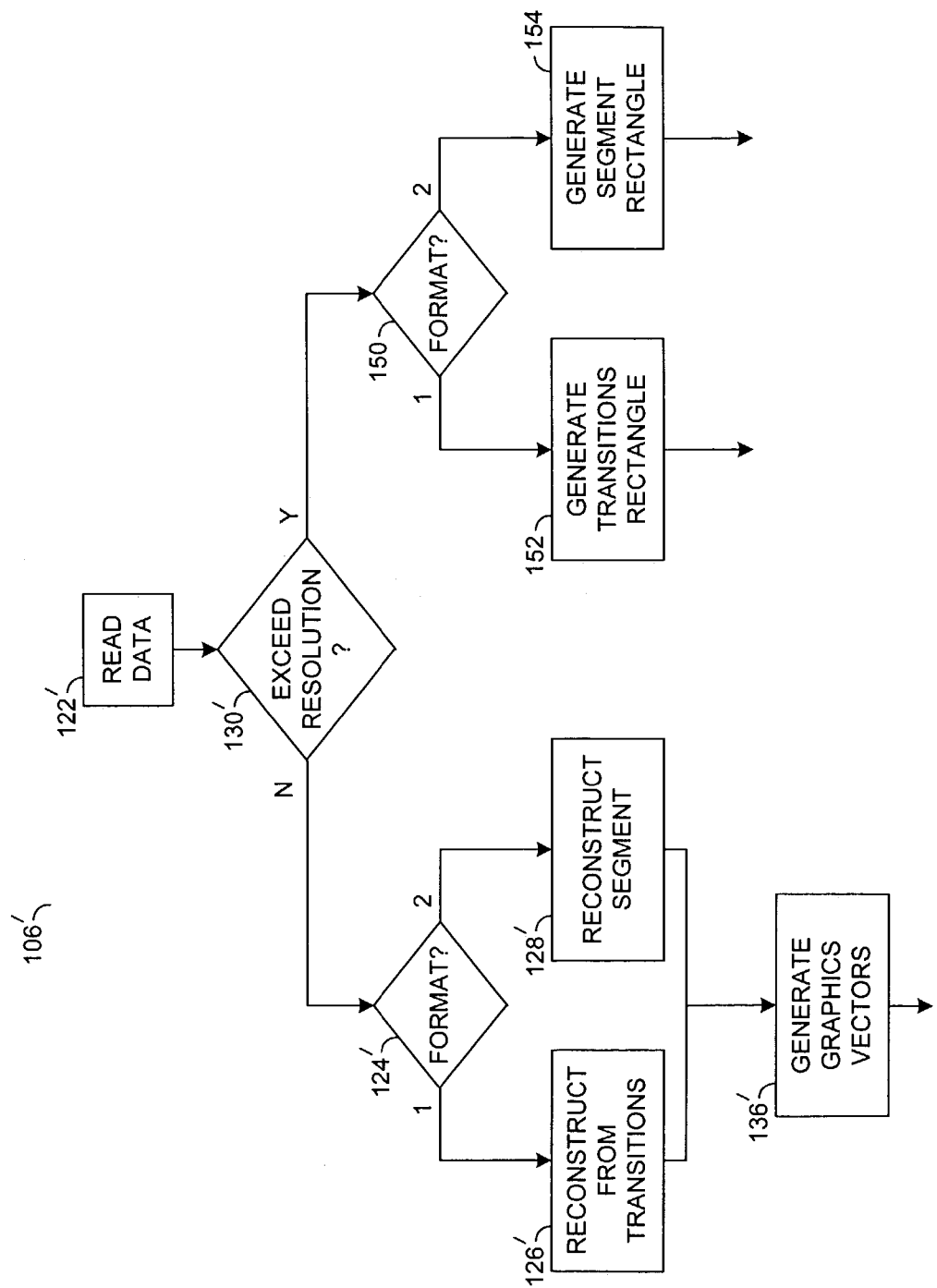
FIG. 13 is a schematic flow diagram illustrating an alternative method used in a second embodiment of the waveform display tool for displaying waveform signals recorded by the waveform simulation tool.

FIG. 13 may illustrate an alternative software application 106' usable in a second embodiment. The same reference numerals (primed) may be used where appropriate. Referring to FIG. 12, step 130' (e.g., to determine whether the waveform may exceed the display resolution) may be carried out before the data may be expanded in steps 126' and 128'. An advantage of performing step 130' early may be that processing overhead by steps 126' and 128' may be avoided when the waveform exceeds the display resolution. When the data from the waveform file 28 is data 46 from the first file format 40, the determination at step 130' may, for example, be based on the time delay between consecutive transitions. When the data from the waveform file 28 is data 62 from the second file format, the determination at step 130' may, for example, be based on the frequency of repetition in the waveform segment.

When at step 130' it may be determined that the waveform may not exceed the display resolution, processing may proceed through steps 124', 126'/128' and 136' to expand and generate a display of the waveform in the same manner as steps 124, 126/128 and 136 discussed above. When at step 130' it may be determined that the waveform may exceed the display resolution, processing may proceed to a second format determination step 150 similar to step 124'. When at step 150' it may be determined that the data from the waveform file 28 may be of the first file format 40, processing may proceed to step 152 at which a filled rectangle corresponding to the consecutive transitions of the data 46 may be generated. For example, the filled rectangle may be similar to the rectangle 142 shown in FIG. 9*a*. When at step 150 it may be determined that the data from the waveform file 28 may be of the second file format 42, processing may proceed to step 154 at which an elongate filled rectangle corresponding to multiple transitions in the segment represented by the data 62 of the second file format 42 may be generated. For example, the elongate filled rectangle may be similar to the rectangle 146 of FIG. 10.

The function performed by the flow diagrams of FIGS. 3, 9 and 13 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICSs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magento-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the sprit and scope of the invention.

The invention claimed is:

1. A method of generating a compressed representation of a simulated waveform, the method comprising the steps of:
   (a) using a computer, processing circuit model information to generate waveform information representing said simulated waveform occurring in a circuit model;
   (b) identifying from said waveform information a segment of stable repetition of a waveform cycle; and
   (c) generating a file in a storage medium, said file comprising said compressed representation defining said segment by (i) cycle information representing said waveform cycle and (ii) repetition information representing said stable repetitions of said waveform cycle to form said segment.

2. The method according to claim 1, wherein said waveform information comprises a plurality of said segments and wherein steps (b) and (c) are repeated for each one of said plurality of said segments.

3. The method according to claim 1, wherein said cycle information comprises a time of occurrence of a first transition edge in said waveform cycle.

4. The method according to claim 1, wherein said cycle information comprises at least one logic transition associated with said waveform cycle.

5. The method according to claim 1, wherein said repetition information comprises information relating to a frequency of repetition of said waveform cycle.

6. The method according to claim 1, wherein said repetition information comprises boundary information relating to a duration of said segment.

7. A storage medium used in a computer for generating a compressed representation of a simulated waveform, the storage medium recording a computer program that is readable and executable by the computer, when executing the computer program the computer performing the steps of:
   (a) processing circuit model information to generate waveform information representing said simulated waveform occurring in a circuit model;
   (b) identifying from said waveform information a segment of stable repetitions of a waveform cycle; and
   (c) generating a file in said storage medium, said file comprising said compressed representation defining said segment as (i) cycle information representing said waveform cycle and (ii) repetition information representing said stable repetitions of said waveform cycle to form said segment.

8. A method of processing compressed simulation waveform information for display, comprising the steps of:
   (a) using a computer, reading from said compressed simulation waveform information, segment information representing a segment of a waveform of multiple cycles, said segment information comprising (i) cycle information representing a waveform cycle in said segment and (ii) repetition information representing repetitions of said waveform cycle to form said segment; and
   (b) processing said segment information to generate a display of said segment of said waveform of multiple cycles.

9. A storage medium used in a computer for processing compressed simulation waveform information for display, the storage medium recording a computer program that is readable and executable by the computer, when executing the computer program the computer performing the steps of:
   (a) reading from said compressed simulation waveform information, segment information representing a segment of a waveform of multiple cycles, said segment information comprising (i) cycle information representing a waveform cycle in said segment and (ii) repetition information representing repetitions of said waveform cycle to form said segment; and
   (b) processing said segment information to generate a display of said segment of said waveform of multiple cycles.

10. A method of generating a compressed representation of a plurality of simulated waveforms, the method comprising the steps of:
    (a) using a computer, processing circuit model information to generate a first waveform information and a second waveform information representing a first of said simulated waveforms and a second of said simulated waveforms occurring in a circuit model;
    (b) generating a file in a storage medium, said file comprising a plurality of first units of information representing said first waveform information in a first compressed form, each of said first units of information being associated with an individual state transition in said first waveform information; and
    (c) generating in said file at least one second unit of information representing said second waveform information in a second compressed form, said second unit of information being associated with a segment of a stable repetition of a waveform cycle.

11. The method according to claim 10, wherein step (c) comprises generating a plurality of said second units of information, each of said second units of information being associated with a respective one of a plurality of said segments of said stable repetition of said waveform cycle.

12. The method according to claim 10, wherein said second unit of information comprises (i) cycle information representing said waveform cycle and (ii) repetition information representing said stable repetition of said waveform cycle to form said segment.

13. A storage medium used in a computer for generating a compressed representation of a plurality of simulated waveforms, the storage medium recording a computer program that is readable and executable by the computer, when executing the computer program the computer program performing the steps of:
    (a) processing circuit model information to generate a first waveform information and a second waveform information representing a first of said simulated waveforms and a second of said simulated waveforms occurring in a circuit model;

(b) generating a file in said storage medium, said file comprising a plurality of first units of information representing said first waveform information in a first compressed form, each of said first units of information being associated with an individual state transition in said first waveform information; and (c) generating in said file at least one second unit of information representing said second waveform information in a second compressed form, said second unit of information being associated with a segment of a stable repetition of a waveform cycle.

14. A method of processing a plurality of compressed representations of a plurality of simulation waveforms for display, said method comprising the steps of:

(a) using a computer, reading from first of said compressed representations, a plurality of first units of information representing a first of said simulated waveforms, each of said first units of information being associated with an individual state transition in said first simulated waveform;

(b) reading from a second of said compressed representations, at least one second unit of information representing a second of said simulated waveforms, said second unit of information being associated with a segment of a stable repetition of a waveform cycle; and (c) processing said first units of information and said second units of information for displaying said first simulated waveform and said second simulated waveform.

15. The method according to claim 14, wherein step (b) comprises reading a plurality of said second units of information, each of said second units of information being associated with a respective one of a plurality of said segments of said stable repetition of said waveform cycle.

16. The method according to claim 14, wherein said second unit of information comprises (i) cycle information representing said waveform cycle and (ii) repetition information representing said stable repetition of said waveform cycle to form said segment.

17. A storage medium used in a computer for processing a plurality of compressed representations of a plurality of simulation waveforms for display, the storage medium recording a computer program that is readable and executable by the computer, when executing the computer program the computer performing the steps of:

(a) reading from a first of said compressed representations, a plurality of first units of information representing a first simulated waveform, each of said first units of information being associated with an individual state transition in said first simulated waveform;

(b) reading from a second of said compressed representations, at least one second unit of information representing a second simulated waveform, said second unit of information being associated with a segment of a stable repetition of a waveform cycle; and (c) processing said first units of information and said second units of information for displaying said first simulated waveform and said second simulated waveform.

18. A method of generating a display of a waveform, comprising the steps of:

(a) using a computer, determining whether a characteristic of said waveform exceeds a predetermined resolution for display;

(b) generating a graphics instruction to display a graphics shape omitting said characteristic when said characteristic is determined to exceed said predetermined resolution for display; and (c) generating at least one second graphics instruction to display a second graphics shape including said characteristic when said characteristic is determined to not to exceed said predetermined resolution for display.

19. The method according to claim 18, wherein said characteristic is a waveform cycle comprising consecutive waveform state transition edges.

20. The method according to claim 19, wherein step (a) comprises the sub-step of:

determining whether a separation between said consecutive waveform state transition edges is less than one display pixel.

21. The method according to claim 18, wherein step (b) comprises the sub-step of:

generating said graphics instruction to display said graphics shape omitting multiple repetitions of said characteristic.

22. The method according to claim 18, wherein step (b) comprises the sub-step of:

generating said graphics instruction to display a filled rectangle in place of said characteristic.

23. The method according to claim 18, wherein generating said at least one second graphics instruction comprises the sub-step of:

generating a plurality of said second graphics instructions to display a sequence of said second graphics shapes representing said characteristic.

24. A storage medium used in a computer for generating a display of a waveform, the storage medium recording a computer program that is readable and executable by the computer, when executing the computer program the computer performing the steps of:

(a) determining whether a characteristic of said waveform exceeds a predetermined resolution for display;

(b) generating a graphics instruction to display a graphics shape omitting said characteristic when said characteristic is determined to exceed said predetermined resolution for display; and (c) generating at least one second graphics instruction to display a second graphics shape including said characteristic when said characteristic is determined to not to exceed said predetermined resolution for display.

25. An apparatus comprising:

a graphics generator responsive to a plurality of graphics instructions to generate a display of one or more graphics shapes; and a processor configured to:

(a) determine whether a characteristic of a waveform exceeds a predetermined resolution for display;

(b) generate a first one of said graphics instructions to display a first one of said graphics shapes omitting said characteristic when said characteristic is determined to exceed said predetermined resolution for display; and (c) generate at least a second one of said graphics instructions to display a second one of said graphics shapes including said characteristic when said characteristic is determined to not to exceed said predetermined resolution for display.

* * * * *